United States Patent [19]

Miyamoto

[11] 4,038,684
[45] July 26, 1977

[54] SIGNAL DETECTION CIRCUIT
[75] Inventor: Seiji Miyamoto, Yao, Japan
[73] Assignee: Sanyo Electric Co., Ltd., Osaka, Japan
[21] Appl. No.: 658,921
[22] Filed: Feb. 18, 1976
[30] Foreign Application Priority Data
    Feb. 18, 1975  United Kingdom ............... 50-20554
[51] Int. Cl.² ............................................. H04N 9/00
[52] U.S. Cl. .................................................. 358/27
[58] Field of Search ............................. 358/26, 27, 40
[56]            References Cited
           U.S. PATENT DOCUMENTS
   3,730,982  5/1973  Niimi et al. ...................... 358/27 X Primary Examiner—Robert L. Richardson
Attorney, Agent, or Firm—Armstrong, Nikaido & Marmelstein

[57]            ABSTRACT

A signal detection circuit particularly suited to formation of an integrated circuit. The circuit includes a detector circuit having a pair of detection transistors whose bases and emitters are respectively connected to collectors or output electrodes of a pair of differential transistors in a differential amplifier circuit for eliminating the employment of capacitor element in the detector circuit so as to facilitate formation of integral circuits for wide applications with stable function and low manufacturing cost.

9 Claims, 14 Drawing Figures

First circuit system

Second circuit system

Third circuit system (a)
First circuit system (b)
Second and third circuit systems

SIGNAL DETECTION CIRCUIT

The present invention relates to a signal detection circuit and, more particularly, to a signal detection circuit suited to be formed into an integrated circuit.

Commonly, signal detection circuits are widely employed in electrical and electronic devices in circuit portions of the latter whereat it is required to obtain D.C. voltage output corresponding to amplitude of A.C. input signal, for example, at automatic color control (referred to as "ACC" hereinbelow) detection in ACC circuits of color television receivers.

Conventionally, as shown in FIG. 1, such a signal detection circuit includes a differential amplifier circuit A having a pair of differential transistors $q1$ and $q2$ and a constant current means having a transistor $q3$ and a resistor $r_2$ for amplifying A.C. signal from a signal source $s$, a detector circuit B having a capacitor $c1$ and diodes $d_1$ and $d_2$ for detecting the amplified signal, and a CR time constant circuit C having a capacitor $c_2$ and a resistor $r_3$ for producing a D.C. output at a terminal $u$, and is generally formed into an integrated circuit except the CR time constant circuit C for compact size and mass production thereof. In the differential amplifier circuit A, the bases of the transistors $q1$ and $q2$ are connected to the signal source $s$, while the collector of the transistor $q1$ is directly connected to the plus side of a voltage source $e1$, with the collector of the transistor $q2$ being also connected to the plus side of the voltage source $e1$ through a resistor $r_1$. The emitters of the transistors $q1$ and $q2$ are connected to each other, with the common junction thereof being coupled to the collector of the transistor $q3$ whose emitter is connected to earth through a resistor $r_2$, while the base of the transistor $q3$ is connected to the plus side of a voltage source $e2$. The common junction of the resistor $r_1$ and the collector of the transistor $q2$ is connected to the series-connected capacitor $c1$ and diode $d2$ of the detector circuit B, with the junction of the latter being connected to earth through the diode $d_1$. The diode $d2$ is further coupled to one side of the parallel-connected capacitor $c2$ and resistor $r3$ of the CR time constant circuit C which is connected to the output terminal $u$, while the other side of the parallel-connected capacitor $c2$ and resistor $r3$ is connected to earth.

The conventional signal detection circuit of the above described type formed into the integrated circuit (referred to as IC hereinbelow), however, has various disadvantages in that, since the detection capacitor $c1$, for example, cannot be integrally formed into such IC, it is necessary to discretely attach such a capacitor to the IC, which arrangement requires at least two more connecting terminals to be formed in the IC, with extra work for connecting the capacitor $c1$ to the IC being consequently necessitated during manufacturing, thus advantage of the IC formation of the signal detection circuit being insufficiently achieved.

Furthermore, when applied to a circuit of a color television receiver, it is impossible for the conventional signal detection circuit of FIG. 1 to be used in such a manner that pulses to extract color burst signal from color signal be applied to the base of the transistor $q3$ forming the constant current source, instead of the predetermined bias voltage being applied to the latter by the D.C. voltage source $e2$ as shown, because in the prior art circuit of FIG. 1, the color burst signal extraction pulse component is inevitably detected at the detector circuit B and superposed on the desired signal for being supplied as an output.

Another conventional signal detection circuit shown in FIG. 2 is one employing double-balancing connection circuit construction and is proposed particularly for obtaining D.C. voltage proportional to the magnitude of the color burst signal B of a color television receiver, in which circuit, the color burst extraction pulses P are applied to the base of the transistor $q3'$ of the constant current source, with the chrominance or color signal Sc being impressed to the bases of the transistors $q1'$ and $q2'$ of the differential amplifier circuit, while the chrominance subcarrier signals CW are applied to the bases of the transistors $q4$, $q5$, $q6$ and $q7$ of the detector circuits for obtaining, at the terminal $u'$, the D.C. voltage corresponding in its magnitude to the amplitude of the color burst signal.

However, the conventional signal detection circuit of FIG. 2 also has disadvantages as follows.

i. Color subcarrier signals CW of the same phase as or opposite phase to the color burst signals B are required.

ii. Although no problems are presented when both of the color signal Sc and the chrominance subcarrier signals CW are respectively applied to the transistors $q_1'$ and $q_2'$, and to the transistors $q4$, $q5$, $q6$ and $q7$ as differential inputs, if such signals Sc and CW are supplied to a single ended push-pull circuit, with the transistors $q_1'$ and $q_2'$ being taken for example, it is impossible to directly connect the bases of the transistors $q_1'$ and $q_2'$ to each other, so that the bases of these transistors to which no signals are applied should be connected to a point of constant-potential, while the bases thereof to which these signals are to be applied should be so arranged as to receive the signals through capacitor element. Accordingly, when two signals Sc and CW are to be applied to the particular base, corresponding two capacitor elements are inevitably required. It should be noted, however, that it is extremely difficult to form such capacitor elements within an integrated circuit or IC, and that if the same capacitor elements be formed into the integrated circuit in some ways or other, the number thereof is unavoidably limited to one, and it is substantially impossible to form two capacitor elements within the same integrated circuit. Accordingly, when the conventional circuit of FIG. 2 is to be used as the single-ended input type, it is necessitated to discretely attach at least one of the capacitor elements to the IC.

iii. The conventional signal detection circuit of FIG. 2 is limited in its application as described hereinbelow with reference to FIGS. 3(A) to 4(B).

In FIGS. 3(A) to 3(C) showing block diagrams of three circuit systems related to the circuit of FIG. 2, a first band-pass amplifier, a color burst signal extraction circuit, a peak detection circuit, a crystal filter, an APC type oscillation circuit and a synchronizing detector circuit are represented by symbols Bp, Be, Pd, Xf, Os and Sd, respectively. In the third circuit system of FIG. 3(C), the color signal component Sc and a video signal component Sb (brightness signal) deviate from each other during weak input signal reception as is seen from FIG. 4(B) showing relation between input signal level Vi and output level Vo of the color television receiver in characteristic curves (pertaining to the second and third circuit systems shown in FIGS. 3(B) and 3(C), while, in the similar curves in FIG. 3(A), the color signal component Sc and the video signal component Sb (brightness signal) show characteristics approximately identical with each other. More specifically, in the first circuit system of FIG. 3(A), when noises are imparted to the color burst signal, output from the peak detection circuit Pd is increased by the amount of the noises, thus reducing the gain of the first band-pass amplifier Bp by that extent, so that the color signal component supplied from the first band-pass amplifier Bp to the color demodulation circuit (not shown) is consequently decreased, thus showing characteristics as shown in FIG. 4(A) due to the noises largely affecting the same particularly during weak signal reception. On the contrary, in the second and third circuit systems of FIGS. 3(B) and 3(C), since the noises are eliminated by the crystal filter Xf or by the synchronizing detector Sd, no control signal due to noise component is applied to the first band-pass amplifier Bp and consequently amplification by the first band-pass amplifier Bp is never suppressed, so that the color signal component during the weak input signal reception wherein the noises are particularly conspicuous is relatively large, thus showing characteristic curves as shown in FIG. 4(B). What should be noted here is that it is difficult to definitely decide which of the characteristics of FIG. 4(A) and FIG. 4(B) is to be employed in the relation of the input signal level to the magnitudes of the color signal component and video signal component, thus characteristics either in FIG. 4(A) or in FIG. 4(B) being finally necessitated depending on various requirements of the color television receiver in question. Incidentally, in the conventional circuit of FIG. 2 of the third circuit system of FIG. 3(C), the characteristics thereof is limited to that of FIG. 4(B), and the characteristics of FIG. 4(A) is not obtained thereby, thus the conventional circuit of FIG. 2 being undesirably restricted in its application.

Accordingly, an essential object of the present invention is to provide a signal detection circuit in which employment of discrete capacitor element in a detector circuit is dispensed with for improved integrated circuit formation, with substantial elimination of disadvantages inherent in the conventional signal detection circuits.

Another important object of the present invention is to provide a signal detection circuit of the above described type which is accurate in functioning and is readily applicable to any electrical or electronic circuits other than the integrated circuits.

A further object of the present invention is to provide a signal detection circuit of the above described type which is readily incorporated in circuits of color television receivers of various types with optimum performance and stability.

A still further object of the present invention is to provide a signal detection circuit of the above described type which is simple in construction and compact in size, with consequent low manufacturing cost.

According to a preferred embodiment of the present invention, the signal detection circuit includes a differential amplifier circuit connected to signal source and having a first output electrode and a second output electrode and to a constant current circuit for amplification of A.C. signal from the signal source, a detector circuit having a first detection transistor and a second detection transistor for detecting the amplified A.C. signal from said differential amplifier circuit, and a CR time constant circuit coupled to the detector circuit for producing rectified D.C. output therefrom. The first output electrode of the differential amplifier circuit is connected to the base of the first detection transistor and emitter of the second detection transistor in the detector circuit, while the second output electrode of the differential amplifier circuit is connected to emitter of the first detection transistor and base of the second detection transistor in the same detector circuit. The collector of the first and second detection transistors are connected to each other at a common junction which is connected to the CR time constant circuit for developing a rectified output at an output terminal. By the above arrangement, capacitor elements in the detector circuit required in the conventional signal detection circuits have advantageously been eliminated, thus making it possible for the signal detection circuit to be readily formed into the integrated circuit or IC with stable functioning, compact size and reduction in manufacturing cost.

These and other objects and features of the present invention will become apparent from the following description taken in conjunction with the preferred embodiment thereof with reference to the attached drawings, in which:

FIG. 5 is an electrical circuit diagram showing construction of a signal detection circuit according to one embodiment of the present invention;

FIGS. 6(A) and 6(B) illustrate wave forms explanatory of the function of the circuit of FIG. 5;

Before the description of the present invention proceeds, it is to be noted that like parts are designated by like reference numerals throughout several views of the attached drawings.

Figure 5:
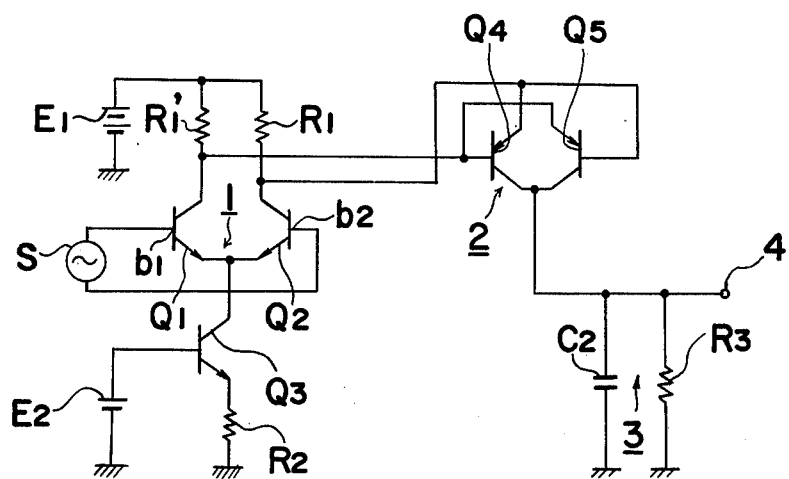

Referring now to FIG. 5, there is shown a signal detection circuit of the invention, which comprises a differential amplifier circuit 1 having a pair of differential transistors Q1 and Q2 and a constant current means including a transistor Q3 and a resistor $R_2$ for amplifying A.C. signal from a signal source S, a detector circuit 2 including a first and a second detection transistors Q4 and Q5 and coupled to the differential amplifier circuit 1, and a CR time constant circuit 3 having a capacitor $C_2$ and a resistor $R_3$ which are connected to the detector circuit 2 and also to a terminal 4 whereat rectified D.C. output is developed. In the differential amplifier circuit 1, the bases of the transistors Q1 and Q2 are connected to the signal source S, while the collectors of the transistors Q1 and Q2 are connected to the plus side of a voltage source $E_1$ through resistors $R_1'$ and $R_1$ respectively. The emitters of the transistors Q1 and Q2 are connected to each other, with a common junction thereof being coupled to the collector of the transistor Q3 whose emitter is connected to earth through a resistor $R_2$, while the base of the transistor Q3 is connected to the plus side of a voltage source $E_2$. In the detector circuit 2, the base of the first detection transistor Q4 and the emitter of the second detection transistor Q5 are connected to one output electrode of the differential amplifier circuit 1, i.e., to the collector of the transistor Q1 of the differential amplifier circuit 1 at the junction of the resistor $R_1'$ and the collector of the transistor Q1, while the emitter of the first detection transistor Q4 and the base of the second detection transistor Q5 are connected to the other output electrode of the differential amplifier circuit 1, i.e., to the collector of the transistor Q2 of the differential amplifier circuit 1 at the junction of the resistor R1 and the collector of the transistor Q2. The collectors of the detection transistor Q4 and Q5 connected to each other at a common junction are further coupled to one side of the parallel-connected capacitor C2 and resistor R3 of the CR time constant circuit 3 which is connected to a terminal 4 for developing rectified output therefrom while the other side of the parallel-connected capacitor C2 and the resistor R3 is connected to earth.

Figure 6:
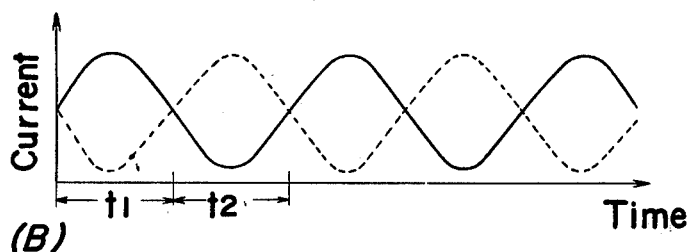
Figure 6:
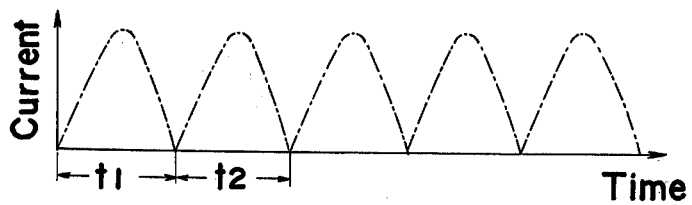

In the above arrangement, the signal from the signal source S is first applied to input electrodes b1 and b2, i.e., to the bases of the transistors Q1 and Q2 of the differential amplifier circuit 1 at opposite phases to each other, so that the collector currents from the transistors Q1 and Q2 give wave forms as shown in FIG. 6(A), in which the real line represents the collector current of the transistor Q1, while the dotted line shows that of the transistor Q2. Upon flowing of such currents having opposite phases to each other in the leads between the differential amplification circuit 1 and the detector circuit 2, the first and second transistors Q4 and Q5 of the detectors circuit 2 are alternately rendered conducting, with a full-wave rectified output current as shown in FIG. 6(B) being consequently obtained in the collectors of the transistors Q4 and Q5 in the detector circuit 2.

Referring particularly to FIGS. 6(A) and 6(B), more specifically, in the time period t1, the collector current of the transistor Q1 is larger than that of the transistor Q2, with the collector potential of the transistor Q1 being lower than that of the transistor Q2 through voltage drops across the resistors $R_1'$ and R1, by which fact, a forward bias voltage is applied across the base and emitter circuit of the first detector transistor Q4 of the detector circuit 2, while a reverse biasing voltage is applied across the base and emitter circuit of the second detector transistor $Q_5'$ of the same circuit 2, thus current which corresponds to the period t1 of FIG. 6(B) flowing in a passage from the voltage source E1, through the resistor R1 and the emitter of the first detecting transistor Q4 to the collector of the same transistor Q4. It is to be noted that the above described current corresponding to the period t1 is equal, in its magnitude, to the difference of the collector currents of the transistors Q1 and Q2. Subsequently, in the time period t2, the conduction is reversed, with a reverse bias voltage being applied across the base and emitter circuit of the first detection transistor Q4, while a forward bias voltage is applied across the base and emitter circuit of the second detection transistor Q5, thus current which corresponds to the period t2 of FIG. 6(B) flowing in a passage from the voltage source E1, through the resistance $R_1'$ and the emitter of the second detection transistor Q5, to the collector of the same transistor Q5. The full-wave rectified signal thus obtained is smoothed by the CR time constant circuit 3 to provide the D.C. signal output developed at the terminal 4.

Figure 7:
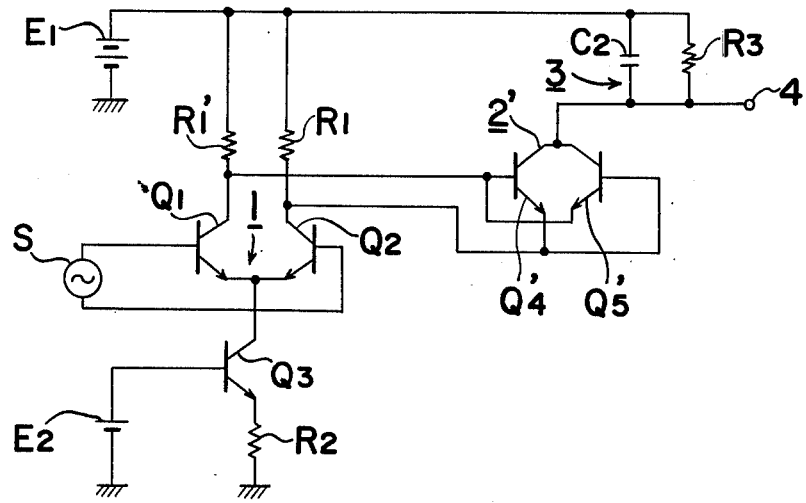
FIGS. 7 and 8 are similar views to FIG. 1, but particularly showing modifications thereof.

Referring to FIG. 7, there is shown a modification of the embodiment of FIG. 5. In this modification, the first and second detection transistors Q4 and Q5 of PNP type described as employed in the detector circuit 2 of FIG. 5 are replaced by first and second detection transistors $Q_4'$ and $Q_5'$ of NPN type, with the base of the transistor $Q_4'$ and the emitter of the transistor $Q_5'$ being connected to one output electrode, i.e., to the collector of the transistor Q1 of the differential amplifier circuit 1, while the emitter of the transistor $Q_4'$ and the base of the transistor $Q_5'$ are connected to the other output electrode, i.e., to the collector of the transistor Q2 of the same circuit 1. The collectors of the transistors $Q_4'$ and $Q_5'$ are connected to each other at a common junction which is coupled to one side of the parallel-connected capacitor C2 and resistor R3 of the CR time constant circuit 3 which is connected to the rectified output terminal 4, while the other side of the parrallel-connected capacitor C2 and resistor R3 is connected to the plus side of the voltage source E1, in which arrangement, the output current from the detector circuit 2' is in the opposite polarity to that from the detector circuit 2 of FIG. 5. Since other construction and function of the signal detection circuit of FIG. 7 is similar to those of the circuit of FIG. 5, detailed description thereof is abbreviated for brevity.

Figure 8:
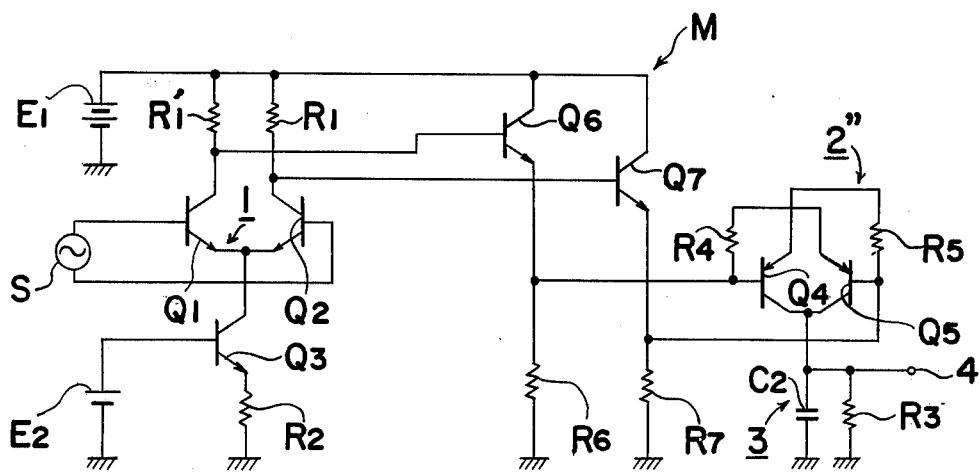

Referring to FIG. 8 showing another modification of the signal detection circuit of FIG. 5, there is further incorporated an emitter follower circuit or grounded collector circuit M between the differential amplifier circuit 1 and the detector circuit 2 of FIG. 5, while resistors R4 and R5 are respectively inserted between the base of the transistor Q4 and the emitter of the transistor Q5 and between the emitter of the transistor Q4 and the base of the transistor Q5 of the detector circuit 2". The emitter follower circuit M includes a transistor Q6 whose base is connected to the collector of the transistor Q1 of the differential amplifier circuit 1, with the collector of the same transistor Q6 being connected to the plus side of the voltage source E1 and also to the collector of a transistor Q7, while the emitter of the transistor Q6 is connected to earth through a resistor R6 and also to the base of the detection transistor Q4 of the detector circuit 2". The base of the transistor Q7 is connected to the collector of the transistor Q2 of the differential amplifier circuit 1, while the emitter of the same transistor Q7 is connected to earth through a resistor R7, by which arrangement, a large output current can be obtained as compared with the circuits of FIGS. 5 and 7.

Figure 9:
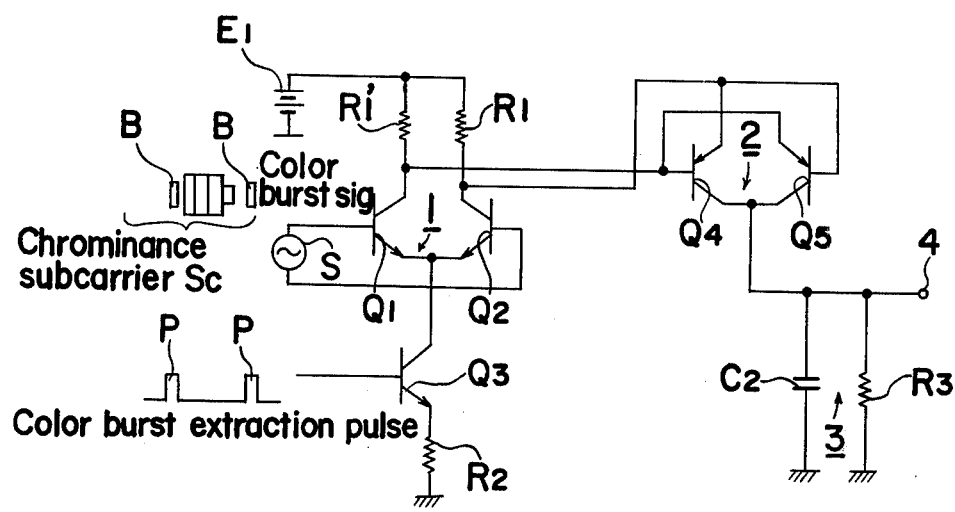
FIG. 9 is a similar view to FIG. 5, but particularly shows application thereof to a circuit of a color television receiver.

Referring to FIG. 9, there is shown the signal detection circuit of the invention detailed with reference to FIG. 5 for explaining application thereof to a color television receiver circuit.

Figure 1:
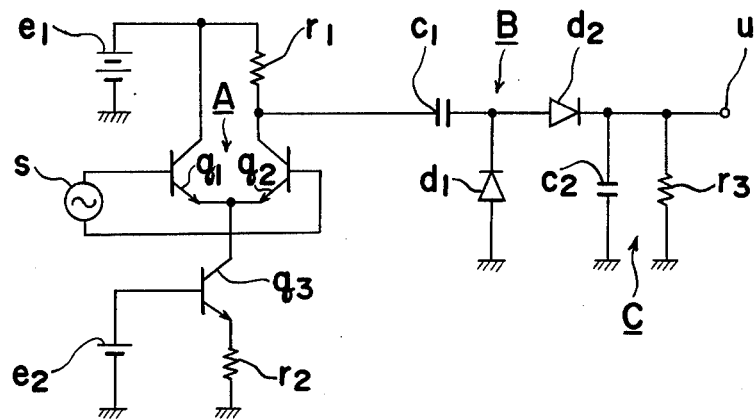
Figure 2:
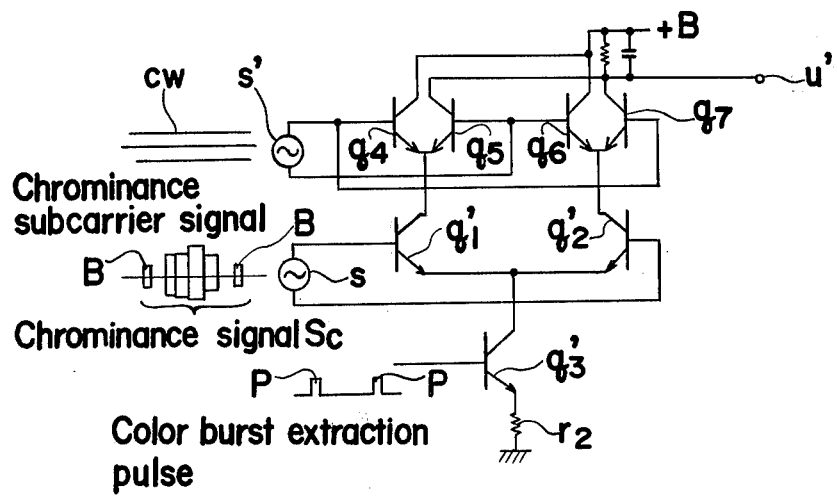
Figure 3:
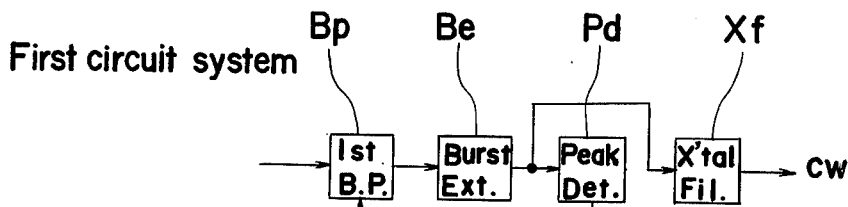
Figure 3:
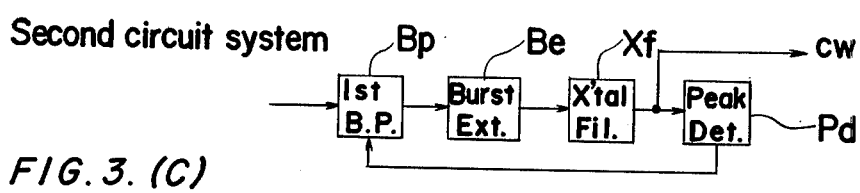
Figure 3:
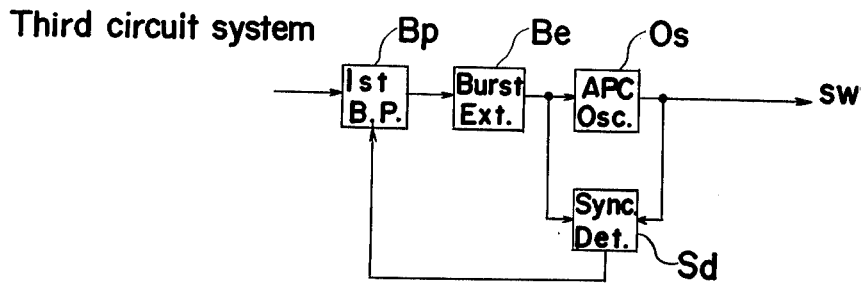
Figure 4:
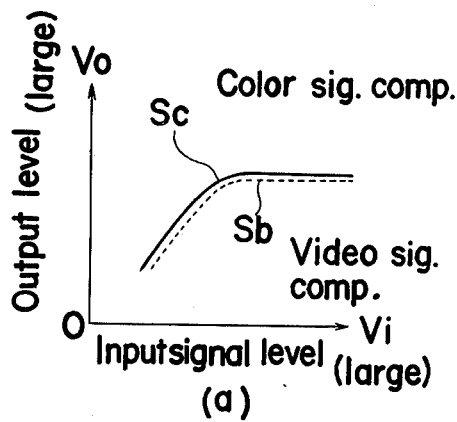
Figure 4:
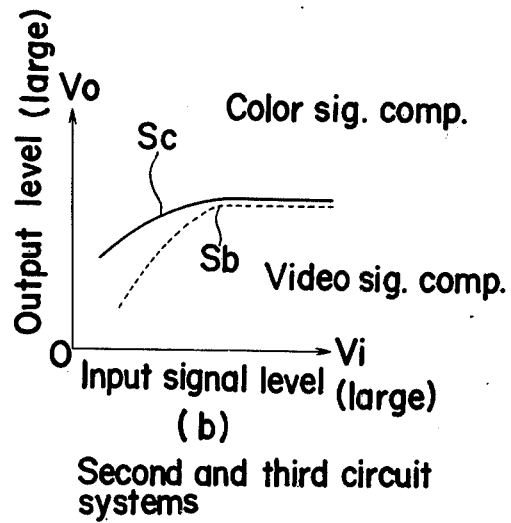

In the circuit arrangement of FIG. 9, the earlier mentioned disadvantage of the conventional signal detection circuit of FIG. 1 that the predetermined bias voltage applied by the voltage source E2 to the base of the transistor Q3 for the constant current source can not be replaced by the color burst signal extraction pulses is advantageously eliminated as described hereinabove. Namely, in the signal detection circuit of the invention, since the color burst extraction pulse component is applied to the bases and emitters of the respective transistors Q4 and Q5 of the detector circuit 2 at the same potential, the same component does not form conduction bias with respect to the transistors Q4 and Q5 and consequently is not put out at the side of the output terminal 4. Accordingly in the circuit of the present invention, it is possible to use the circuit in such a manner that the D.C. output voltage proportional to the magnitude of the color burst signal B is obtained at the output terminal 4, through application of the pulses P (replaced frequency of 15.75 kHZ) for extracting color burst signal B from the chrominance signal Sc to the base of the transistor Q3, with the transistors Q1 and Q2 being turned on only during the pulse period. It is needless to say that such usage of the circuit of the invention is also applicable to the modified circuits of the invention detailed with reference to FIGS. 7 and 8.

Figure 10:
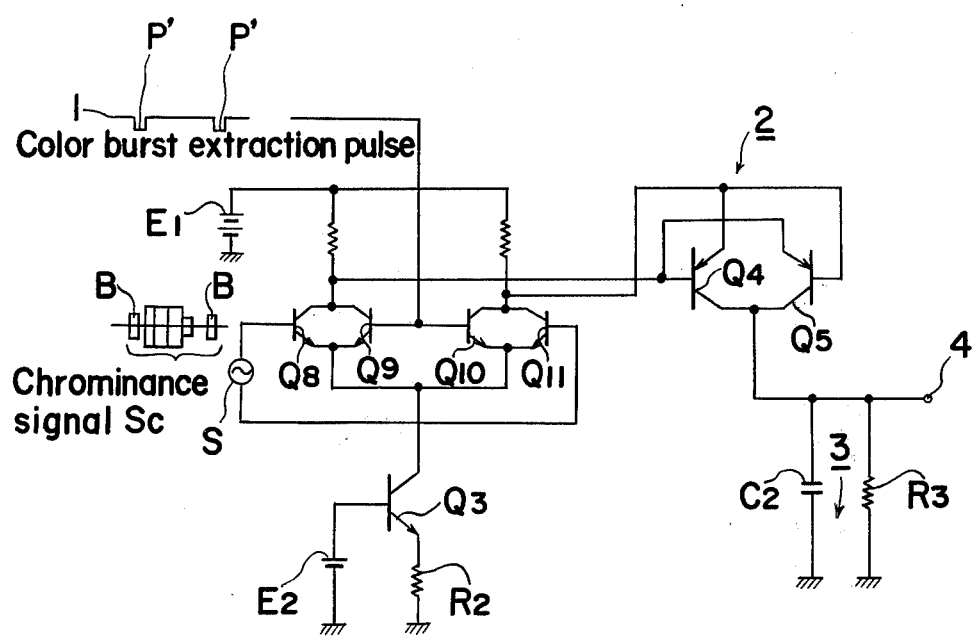
FIG. 10 is a similar view to FIG. 9, but particularly shows a modified application thereof to a circuit of a color television receiver.

Reference is had to FIG. 10, there is shown another application of the signal detection circuits of the present invention to the color television receiver circuit. In this application, two pairs of differential transistors Q8 and Q9, and Q10 and Q11 are employed, with the bases of the transistors Q8 and Q11 being connected to the signal source S, and with the emitters of the transistors Q8 and Q9 and the emitters of the transistors Q10 and Q11 which are respectively connected to each other being further connected at a common junction to the collector of the transistor Q3 of the constant current circuit, while the bases of the transistors Q9 and Q10 are connected to each other for being applied, at the common junction thereof, with a large positive bias voltage at all times, to which junction the negative color burst extraction pulses P' are applied as shown for cancelling said large positive bias voltage. More specifically, the large positive bias voltage which is applied to the bases of the transistors Q9 and Q10 and which may be represented in the form of a level line $l$ of the wave form for the negative color burst extraction pulses P' is sufficiently large to deeply bias the transistors Q9 and Q10 and to turn off the transistors Q8 and Q11. Upon receipt of the color burst extraction pulses P', i.e., at the potential p, the transistors Q9 and Q10 are turned off, while the transistors Q8 and Q11 are turned on, with the burst signal B appearing in the collectors of the transistors Q8 and Q11.

It is to be noted that in the signal detection circuit of the invention, the earlier mentioned disadvantages described with referecne to FIGS. 2 to 4(B) are substantially eliminated. In other words, the signal detection circuit of the invention has various advantages over the conventional circuit of FIG. 2 as follows.

i. The chrominance subcarrier signals CW of the same phase as or opposite phase to the color burst signal B are not required.

ii. Even when the input signals, i.e., the chrominance signal Sc and the chrominance subcarrier signal CW are applied to the differential transistors of single-ended push-pull type, only one capacitor element is necessary for connection to the input electrodes of the differential transistors, so that if such a capacitor is formed into the integrated circuit, no separate or discrete capacitor is required to be connected to the integrated circuit.

iii. Since the circuit of the present invention is applicable to both of the circuit systems of FIGS. 3(A) and 3(B) either of the characteristics described with reference to FIGS. 4(A) and 4(B) is readily obtainable, thus a wide variety of applications of the circuit being advantageously achieved.

As is clear from the foregoing description, the signal detection circuit of the invention wherein no capacitor element is employed as a detector is quite suitable for integrated circuit formation except for the CR time constant circuit 3. Furthermore, any unbalancing in the D.C. level arising from deviations in the values of load resistors R$_1$'and R1 can advantageously be offset by the detecting transistors Q4 and Q5, with consequent less error in functioning. It is to be noted that the concept of the signal detection circuit of the invention is not limited, in its application, to integrated circuit formation alone, but can readily be applicable to any other circuit, for example, to the color television receiver circuit wherein stable functioning, compact size and low manufacturing cost are required.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as included therein.

What is claimed is:

1. A signal detection circuit which comprises a differential amplifier circuit connected to an A.C. signal source and having a pair of first and second output electrodes and a constant current circuit for amplification of the signal from said A.C. signal source, a detector circuit coupled to said differential amplifier circuit said detector circuit including a first transistor and a second transistor for detecting the amplified A.C. signal from said differential amplifier circuit, and a time constant circuit coupled to said detector circuit for producing a rectified D.C. output therefrom, said first output electrode of said differential amplifier circuit being connected to the base of said first transistor and the emitter of said second transistor, with said second output electrode of the differential amplifier circuit being connected to the emitter of said first transistor and the base of said second transistor, and wherein the collectors of said first and second transistors are connected to each other and coupled to said time constant circuit.

2. A signal detection circuit as claimed in claim 1, wherein said differential amplifier circuit comprises third and fourth transistors and said first and second output electrodes are the collectors of said third and fourth transistors each of said collectors being connected to a first D.C. voltage source through a resistor, the bases of said third and fourth transistors being connected to the A.C. signal source, and the emitters of said third and fourth transistors being connected to each other at a common junction and wherein said constant current circuit includes a fifth transistor, said fifth transistor having an emitter connected to ground through a resistor, a base connected to a second D.C. voltage source and a collector coupled to said common junction.

3. A signal detection circuit as claimed in claim 1, wherein said first and second transistors in said detector circuit are PNP transistors and wherein said time constant circuit comprises a parallel connected capacitor and resistor, said parallel connected capacitor and resistor having one side connected to ground and the other side connected to the collectors of said PNP transistors.

4. A signal detection circuit as claimed in claim 1, wherein said first and second transistors in said detector circuit are NPN transistors and wherein said time constant circuit comprises a parallel connected capacitor and resistor, said parallel connected capacitor and resistor having one side connected to said first D.C. voltage source and the other side connected to the collectors of said NPN transistors.

5. A signal detection circuit as claimed in claim 1 further comprising an emitter follower circuit inserted between said differential amplifier circuit and said detector circuit, with path resistors being connected between the base of said first transistor and the emitter of said second transistor and between the emitter of said first transistor and the base of said second transistor.

6. A signal detection circuit as claimed in claim 5, wherein said emitter follower circuit includes a sixth transistor having a base connected to said first output electrode of said differential amplifier circuit, a collector connected to the first D.C. voltage source and the first and second output electrodes, and an emitter connected to the base of said first transistor of said detector circuit and to ground through a resistor, and a seventh transistor having a base connected to said second output electrode of said differential amplifier circuit, a collector connected to the first D.C. voltage source and the first and second output electrodes, and an emitter connected to the base of said second detection transistor of said detector circuit and to ground through a resistor.

7. A signal detection circuit for use in a color television receiver circuit which comprises a differential amplifier circuit connected to signal source and having a pair of first and second output electrodes and a constant current circuit for amplification of a chrominance signal including a color burst signal applied to said signal source, a detector circuit including a first transistor and a second transistor for detecting said amplified signal from said differential amplifier circuit and coupled to the differential amplifier circuit, and a time constant circuit coupled to said detector circuit for producing a rectified D.C. output therefrom, said first output electrode of said differential amplifier circuit being connected to the base of said first transistor and the emitter of said second transistor, with said second output electrode of the differential amplifier circuit being connected to the emitter of said first transistor and the base of said second transistor, and wherein the collectors of said first and second transistors are connected to each other and to said time constant circuit.

8. A signal detection circuit for use in a color television receiver circuit as claimed in claim 7, wherein said differential amplifier circuit comprises third and fourth transistors and said first and second output electrodes are the collectors of said third and fourth transistors, said collectors being connected to a D.C. voltage source through resistors, the bases of said third and fourth transistors being connected to said signal source, and the emitters of said third and fourth transistors being connected to each other at a common junction thereof, and wherein said constant current circuit comprises a fifth transistor, said fifth transistor having an emitter connected to ground through a resistor, a base connected to a source developing color burst extraction pulses of said color television receiver circuit for obtaining D.C. output voltage proportional to magnitude of said color burst signal and a collector connected to the emitters of said third and fourth transistors.

9. A signal detection circuit for use in a color television receiver circuit as claimed in claim 7, wherein said differential amplifier circuit comprises third, fourth, fifth and sixth transistors and said first output electrode is the common junction of the collectors of said third and fourth transistors and the second output electrode is the common junction of the collectors of said fifth and sixth transistors, each of said common junctions being connected to a D.C. voltage source through a resistor, the base of said third transistor being connected to base of said sixth transistor, and the base of said fourth transistor being connected to the base of said fifth transistor the bases of said fourth and fifth transistors having a predetermined large bias voltage applied thereto at all times and connected, at a common junction thereof, to a source of negative color burst extraction pulses of said color television receiver circuit for cancelling said positive bias voltage, and wherein said constant current circuit comprises a seventh transistor having an emitter connected to ground through a resistor, a base connected to another D.C. voltage source and a collector connected to the emitters of said third, fourth, fifth and sixth transistors.

* * * * *